United States Patent
Cai et al.

(10) Patent No.: US 11,398,481 B2
(45) Date of Patent: Jul. 26, 2022

(54) INVERTER CELL STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yan Fei Cai, Shanghai (CN); Yuan Chai, Shanghai (CN); Kai Hua Hou, Shanghai (CN); Jian Chen, Shanghai (CN); Jun Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/885,619

(22) Filed: May 28, 2020

(65) Prior Publication Data
US 2020/0381433 A1    Dec. 3, 2020

(30) Foreign Application Priority Data
May 29, 2019    (CN) .......................... 201910458687.6

(51) Int. Cl.
*H01L 27/092* (2006.01)
*H01L 23/522* (2006.01)
(Continued)

(52) U.S. Cl.
CPC .. *H01L 27/0924* (2013.01); *H01L 21/823821* (2013.01); *H01L 21/823828* (2013.01); *H01L 21/823857* (2013.01); *H01L 21/823871* (2013.01); *H01L 23/5226* (2013.01); *H01L 23/5286* (2013.01); *H01L 27/0207* (2013.01); *H01L 27/092* (2013.01); *H01L 29/66795* (2013.01); *H01L 29/785* (2013.01)

(58) Field of Classification Search
CPC . H01L 21/8238–823892; H01L 27/092–0928; H01L 27/11807; H01L 27/0207; G06F 30/392; G06F 30/294
See application file for complete search history.

(56) References Cited

U.S. PATENT DOCUMENTS

2013/0320439 A1* 12/2013 Nishizaki .............. H01L 27/088
257/330
2017/0133386 A1* 5/2017 Lee .................. H01L 21/823878
(Continued)

*Primary Examiner* — Younes Boulghassoul
(74) *Attorney, Agent, or Firm* — Anova Law Group, PLLC (57) ABSTRACT

Semiconductor cell structure and forming method thereof are provided. The semiconductor cell structure includes: a substrate including a first section and third regions on both sides of the first section in a first direction; and a first gate structure group including one or more first gate structures on the substrate. The first section includes a first region and a second region aligned along the first direction in the first section. The first region and the second region are configured to form transistors have a type opposite to a type of transistors configured to be formed in the third regions. The one or more first gate structures extend along the first direction across the first region, the second region, and the third regions on both sides of the first section.

19 Claims, 5 Drawing Sheets

(51) Int. Cl.
  *H01L 23/528* (2006.01)
  *H01L 21/8238* (2006.01)
  *H01L 29/66* (2006.01)
  *H01L 29/78* (2006.01)
  *H01L 27/02* (2006.01)

(56) References Cited

U.S. PATENT DOCUMENTS

| | | | |
|---|---|---|---|
| 2017/0243861 A1* | 8/2017 | Wang | G06F 30/39 |
| 2017/0373090 A1* | 12/2017 | Correale, Jr. | H01L 27/0207 |
| 2018/0323215 A1* | 11/2018 | Chong | G06F 30/392 |
| 2019/0006372 A1* | 1/2019 | Lu | H01L 21/823842 |
| 2019/0155984 A1* | 5/2019 | Chen | G06F 30/39 |
| 2019/0198530 A1* | 6/2019 | Hino | H01L 29/78696 |
| 2019/0393205 A1* | 12/2019 | Lee | H01L 27/092 |
| 2020/0105752 A1* | 4/2020 | Liaw | H01L 29/42392 |

* cited by examiner

INVERTER CELL STRUCTURE AND FORMING METHOD THEREOF

CROSS-REFERENCES TO RELATED APPLICATIONS

This application claims priority of Chinese Patent Application No. 201910458687.6, filed on May 29, 2019, the entire contents of which are hereby incorporated by reference.

FIELD OF THE DISCLOSURE

The present disclosure generally relates to the field of semiconductor manufacturing and, more particularly, relates to a semiconductor cell structure and a forming method thereof.

BACKGROUND

A semiconductor cell structure is a standard unit commonly used in circuit design. Specifically, required semiconductor cell structures are stitched together to form a desired circuit.

Generally, a semiconductor cell structure includes a PMOS transistor and a NMOS transistor. The PMOS transistor is in a P region and the NMOS transistor is in an N region. The PMOS transistor and the NMOS transistor share a gate structure as the gate structure extends to the P region and the N region. Both ends of the gate structure are disconnected.

However, the performance of existing semiconductor cell structure needs to be improved.

BRIEF SUMMARY OF THE DISCLOSURE

One aspect of the present disclosure provides a semiconductor cell structure. The semiconductor cell structure includes: a substrate including a first section and third regions on both sides of the first section in a first direction; and a first gate structure group including one or more first gate structures on the substrate. The first section includes a first region and a second region aligned along the first direction in the first section. The first region and the second region are configured to form transistors have a type opposite to a type of transistors configured to be formed in the third regions. The one or more first gate structures extend along the first direction across the first region, the second region, and the third regions on both sides of the first section.

Another aspect of the present disclosure provides a method for forming a semiconductor cell structure. The method includes providing a substrate and forming a first gate structure group including one or more first gate structures formed on the substrate. The substrate includes a first section and third regions on both sides of the first section in a first direction. The first section includes a first region and a second region aligned along the first direction. The first region and the second region are configured to form transistors have a type opposite to a type of transistors configured to be formed in the third regions. The one or more first gate structure extend along the first direction to the first region, the second region, and the third regions on both sides of the first section.

Other aspects or embodiments of the present disclosure can be understood by those skilled in the art in light of the description, the claims, and the drawings of the present disclosure.

DETAILED DESCRIPTION

Figure 1:
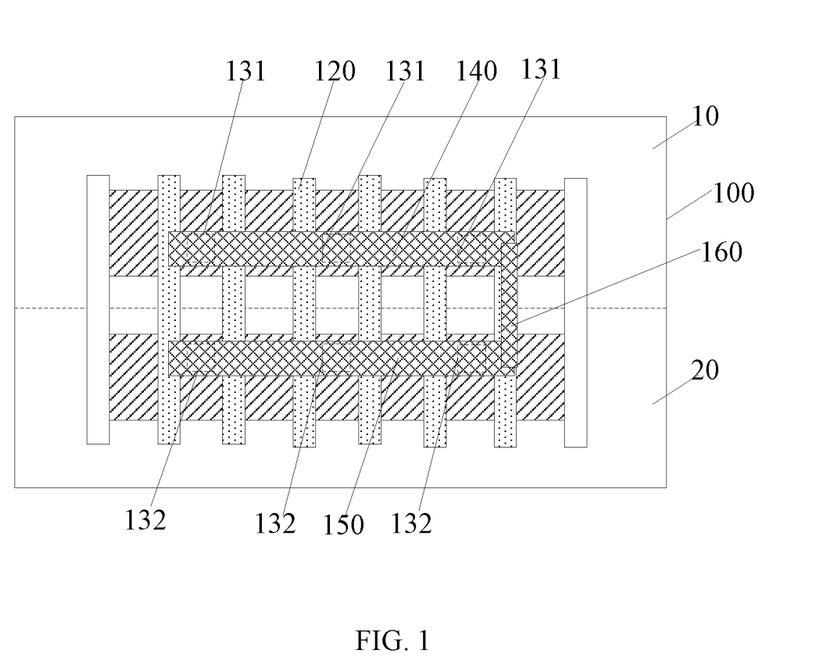
FIG. 1 illustrates a schematic diagram of an inverter unit structure.

FIG. 1 illustrates a schematic diagram of an inverter unit structure. The inverter unit structure includes: a substrate 100, the substrate 100 including a first region 10 and a second region 20 aligned along a first direction X, the first region being configured to form NMOS transistors and the second region being configured to form PMOS transistors; one or more first gate structures 120 on the substrate 100, the one or more first gate structures 120 extending along the first direction X to the first region 10 and the second region 20; first source regions and first drain regions in the first region 10 respectively on both sides of the one or more first gate structures 120; first plugs 131 on the first drain region; second plugs 132 on the second drain region; and first connection structures connecting to each first plug 131 and each second plug 132. The first connection structure includes: a first connection layer 140 connecting to each first plug 131; a second connection layer 150 connecting to each second plug 132; a third connection layer 160 connecting to the first connection layer 140 and the second connection layer 150; gate plugs (not shown) on the first gate structures 120; and a fourth connection layer (not shown) connecting to each gate plug.

In the above inverter unit structure, since both ends of a first gate structure 120 in the first direction are disconnected, a gate stress is generated on the first gate structure 120. The gate stress is transferred to a channel region at a bottom of the first gate structure 120, resulting in an unpredictable stress in the channel region at the bottom of the first gate structure 120. For example, reducing the carriers in the channel of the second region results in reducing an operating speed of the inverter cell structure.

Based on the above description, the present disclosure provides a semiconductor cell structure including: a substrate including a first section and third regions on both sides of the first section in a first direction, a first region and a second region aligned in the first direction in the first section, a type of transistors configured to be formed in the first region and the second region being opposite to a type of transistors configured to be formed in the third regions; a first gate structure group including first gate structures on the substrate, the first gate structures extending along the first direction to the first region, the second region, and the third regions on the two sides of the first section.

In order to make the above objectives, features, and advantages of the present disclosure more comprehensible, specific embodiments of the present disclosure will be described in detail below with reference to the accompanying drawings.

FIGS. 2-5 illustrate schematic diagrams of a semiconductor cell structure consistent with various disclosed embodiments of the present disclosure.

In one embodiment, the semiconductor cell structure as an inverter cell structure is taken as an example. In other embodiments, the semiconductor cell structure includes a CMOS cell device.

Figure 2:
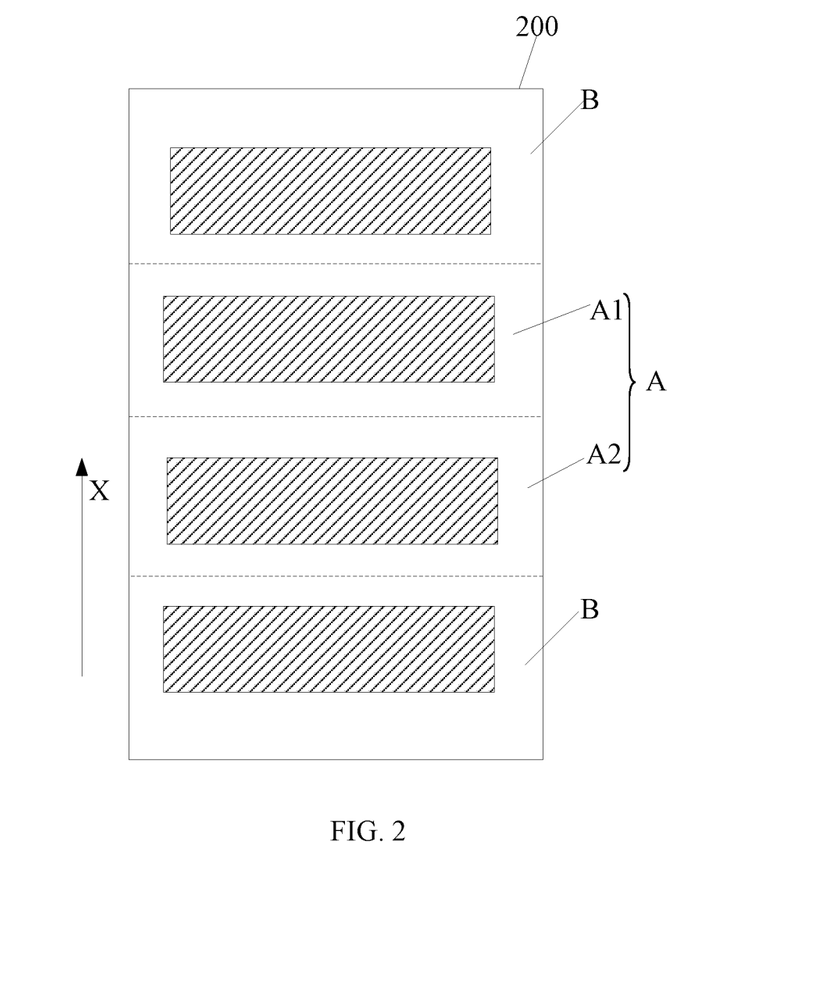
FIGS. 2-5 illustrate schematic diagrams of a semiconductor cell structure consistent with various disclosed embodiments of the present disclosure.

Referring to FIG. 2, a substrate 200 is provided. The substrate 200 includes a first section A and third regions B on both sides of the first section A in a first direction X. The first section A includes a first region A1 and a second region A2 aligned in the first direction X. A type of transistors configured to be formed in the first region A1 and the second region A2 is opposite to a type of transistors configured to be formed in the third regions B.

In one embodiment, the substrate 200 includes a semiconductor base and fins on the semiconductor substrate. An extending direction of a fin is perpendicular to the first direction X and parallel to the surface of the semiconductor base. All the first region A1, the second region A2, and the third regions B of the semiconductor base have fins.

In another embodiment, the substrate is a planar semiconductor base.

A material of the semiconductor substrate includes single crystal silicon, single crystal germanium, or single crystal silicon germanium.

In one embodiment, the first region A1 and the second region A2 are configured to form PMOS transistors, and the third regions B are configured to form NMOS transistors.

In other embodiments, the first region A1 and the second region A2 are configured to form NMOS transistors, and the third regions B are configured to form PMOS transistors.

The area indicated by hatched lines in FIG. 2 is an active area.

Figure 3:
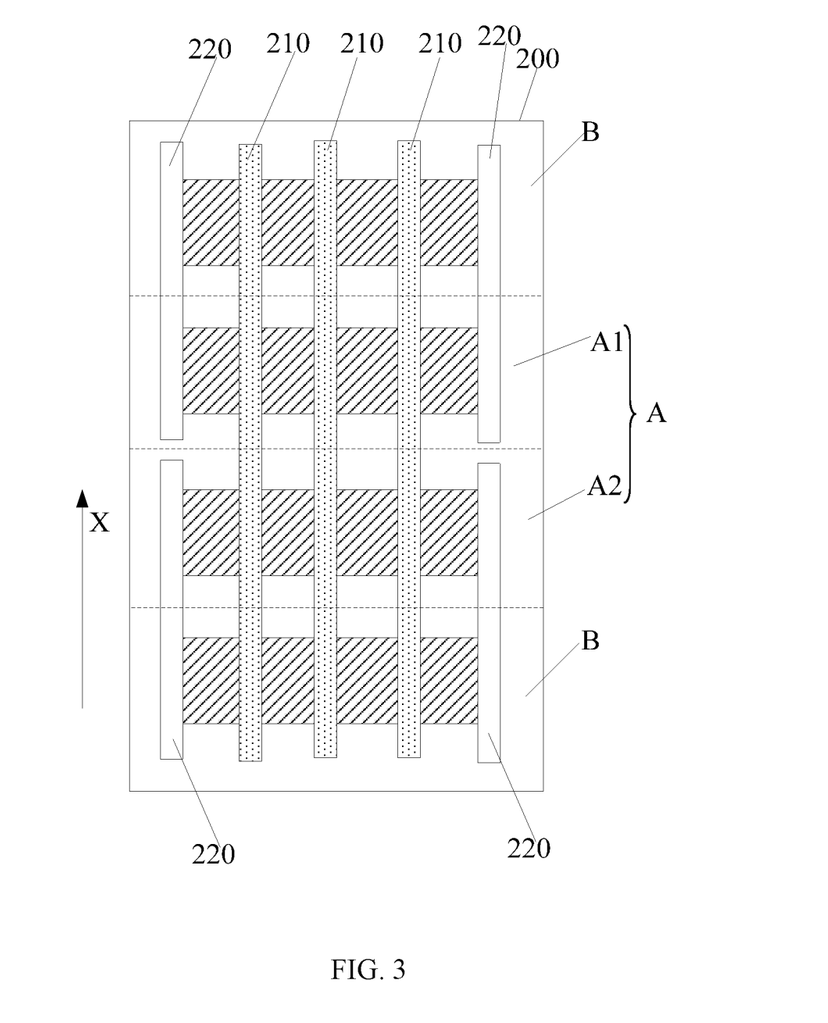

Referring to FIG. 3, a first gate structure group is formed on the substrate 200. The first gate structure group includes first gate structures 210 that extends along the first direction X to the first region A1, the second region A2, and the third regions B on both sides of the first section A. First source regions and first drain regions are respectively formed in the first region A1 and the second region A2 on both sides of the first gate structures 210. Second source regions and second drain regions are formed respectively in the third regions B on both sides of the first gate structures 210.

The first gate structures 210 includes first gate dielectric layers and first gate electrode layers on the first gate dielectric layers. In one embodiment, a material of the first gate dielectric layers is silicon oxide, and a material of the first gate electrode layers is polysilicon. In another embodiment, the material of the first gate dielectric layers is a high-K (K greater than 3.9) dielectric material, and the material of the first gate electrode layer is metal.

The number of the first gate structures 210 is one or plural. In one embodiment, a plurality of first gate structures 210 is taken as an example for description.

The semiconductor cell structure further includes second gate structures 220 on the substrate 200 formed respectively on both sides of the first gate structure group. Part of the second gate structures 220 extends along the first direction X to adjacent first region A1 and third regions B. Part of the second gate structures 220 extends along the first direction X to adjacent second region A2 and the third regions B. Second gate structures 220 on the first region A1 and second gate structures 220 on the second region A2 are disconnected. Or, the second gate structures extend along the first direction to the first region, the second region, and the third regions on both sides of the first section.

The second gate structures 220 include second gate dielectric layers and second gate electrode layers on the second gate dielectric layers. In one embodiment, a material of the second gate dielectric layers is silicon oxide, and a material of the second gate electrode layer is polysilicon. In another embodiment, the material of the second gate dielectric layers is a high-K (K greater than 3.9) dielectric material, and the material of the second gate electrode layer is metal.

Functions of the second gate structures 220 include that the second gate structures 220 are not electrically connected, and the second gate structures are on both sides of the first gate structure group, so that when adjacent semiconductor cell structures are spliced together, the second gate structures isolate the first gate structures in the adjacent semiconductor cell structures to avoid shorting the first gate structures in the adjacent semiconductor cell structure.

In one embodiment, the substrate includes a semiconductor base and fins. The first gate structures 210 straddle the fins of the first region A1, the second region A2, and the third regions B. Part of the second gate structures 220 spans the fins on adjacent first region A1 and third region B. Part of the second gate structures 220 straddles fins on adjacent second region A2 and third region B.

In one embodiment, the semiconductor cell structure includes a first dielectric layer formed on the substrate 200. The first dielectric layer covers sidewalls of the first gate structures 210 and sidewalls of the second gate structures 220 and exposes top surfaces of the first gate structures 210 and top surfaces of the second gate structures 220.

In other embodiments, a first dummy gate structure group is formed on the substrate. The first dummy gate structure group includes first dummy gate structures. The first dummy gate structures extend along the first direction X to the first region, the second region, and the third regions on both sides of the first section. Second dummy gate structures are formed respectively on the substrate on both sides of the first dummy gate structure group. Part of the second dummy gate structures extend along the first direction X to adjacent first and third regions. Part of the second dummy gate structures extend along the first direction to adjacent second and third regions. The second dummy gate structures on the first region and the second dummy gate structures in the second region are disconnected. Or the second dummy gate structures extend along the first direction to the first region, the second region, and the third regions on both sides of the first section. First source regions and first drain regions are formed respectively in the first region and the second region on both sides of the first dummy gate structures. Second source regions and second drain regions are formed respectively in the third regions on both sides of the first dummy gate structures. First dielectric layers are formed on the substrate. The first dielectric layers cover sidewalls of the first dummy gate structures and sidewalls of the second dummy gate structures and expose top surfaces of the first dummy gate structure and top surfaces the second dummy gate structure. The first dummy gate structures are removed to form a first gate opening and the second dummy gate structures are removed to form a second gate opening. First gate structures are formed in the first gate opening, and second gate structures are formed in the second gate opening. The one or more first gate structures and the second gate structures are both metal gate structures.

Figure 4:
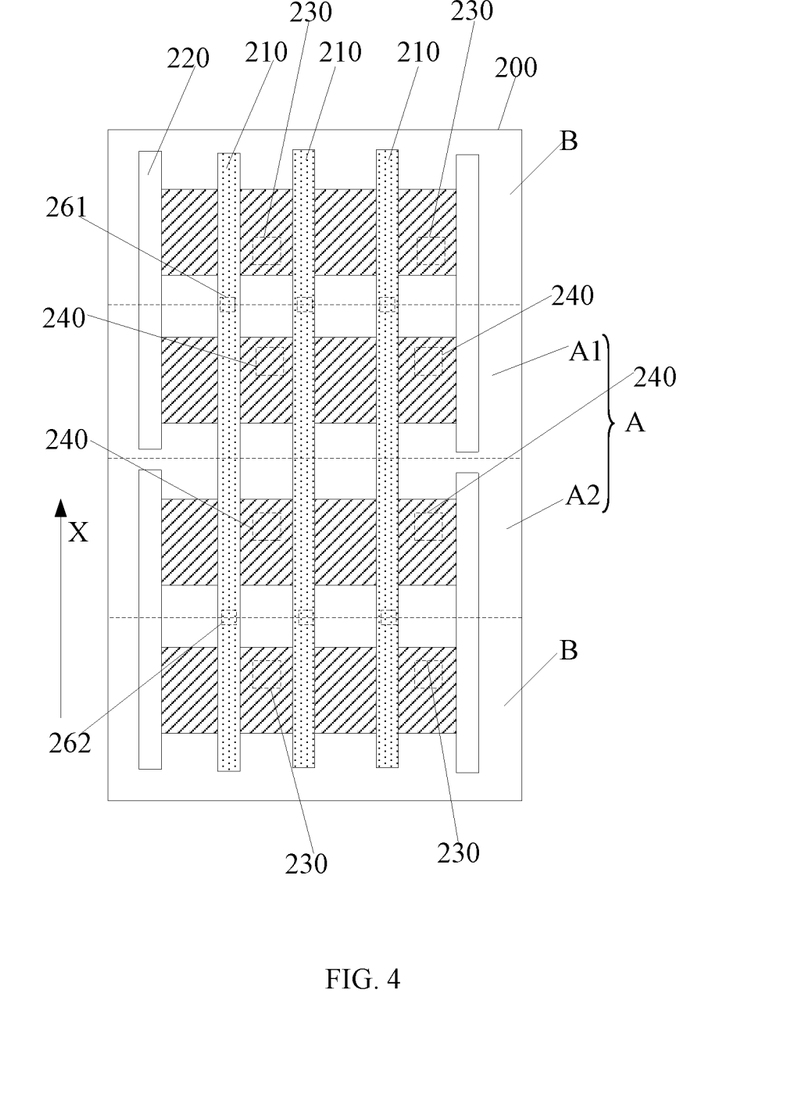

Referring to FIG. 4, first plugs 240 are formed on the first drain regions. second plugs 230 are formed on the second drain regions. First gate plugs 261 and second gate plugs 262 are formed on each first gate structure 210. The first gate plugs 261 are located between adjacent first region A1 and third region B, and the second gate plug 262 are located between adjacent second region A2 and third region B.

Specifically, second dielectric layers are formed on the first dielectric layer, the one or more first gate structures 210, and the second gate structures 220. First plugs 240 are formed on the first drain regions and penetrate the first dielectric layers and the second dielectric layers. Second plugs 230 are formed on the second drain regions and penetrate the first dielectric layers and the second dielectric layers. The first gate plugs 261 penetrate the second dielectric layers on the first gate structure 210, and the second gate plugs 262 penetrate the second dielectric layers on the one or more first gate structures 210.

The method for forming a semiconductor cell structure further includes: forming third plugs on the first source regions; and forming fourth plugs on the second source regions.

The semiconductor cell structure is an inverter unit structure. When a type of transistors configured to be formed in the first region and second regions is a P type and a type of transistors configured to be formed in the third regions is an N type, the third plugs are electrically connected to a power line, and the fourth plugs are electrically connected to a ground line. When the type of transistors configured to be formed in the first and second regions is an N type and the type of transistors configured to be formed in the third regions is a P type, the third plugs are electrically connected to the ground line, and the fourth plugs are electrically connected to the power line.

Figure 5:
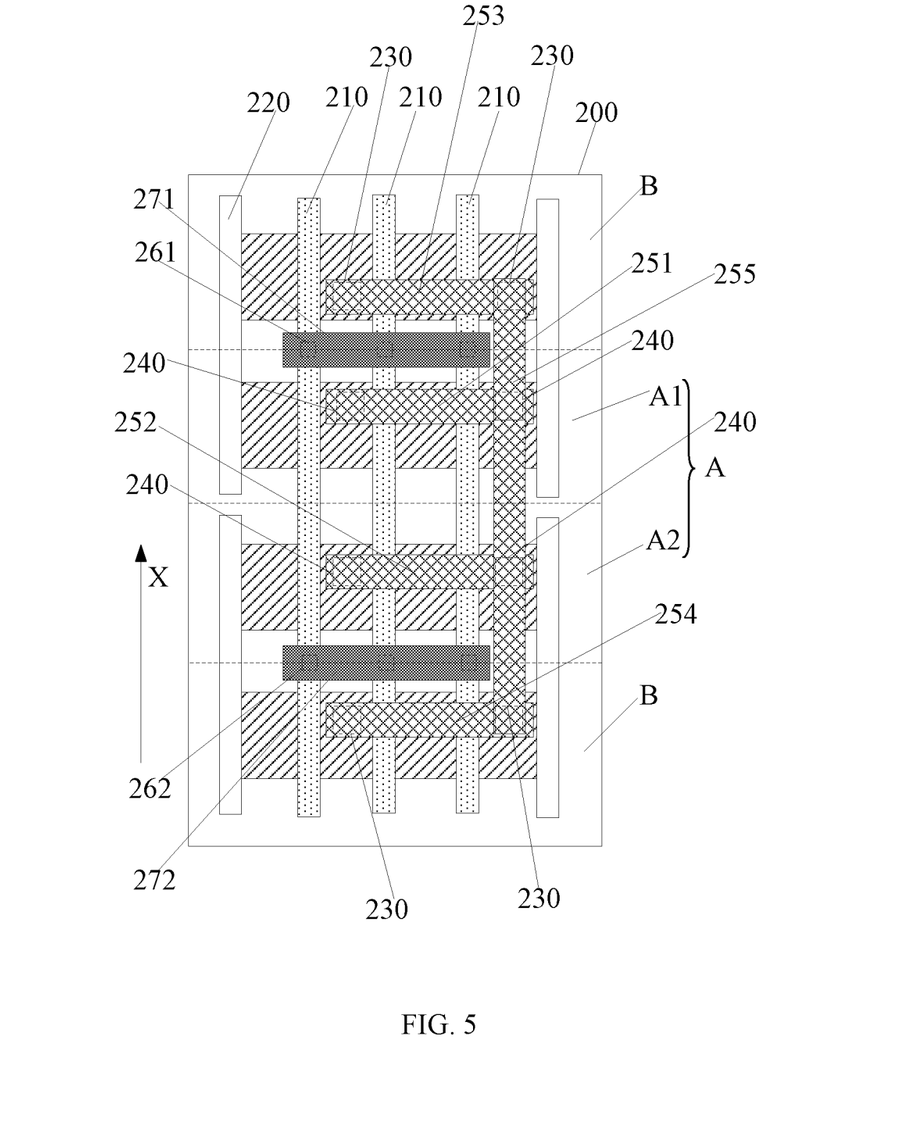

Referring to FIG. 5, a first connection structure is formed that connects to each first plug 240 and each second plug 230.

The method for forming the first connection structure includes: forming a first connection layer 251 on the first region A1, the first connection layer 251 connecting to a top surfaces of each first plugs 240 on the first region A1; forming a second connection layer 252 on the second region A2, the second connection layer 252 connecting to a top surface of each first plug 240 on the second region A2; forming a third connection layer 253 on a third region B on a side of the first section A in the first direction X, the third connection layer 253 connecting to a top surface of each second plug 230 on the side of the first section A in the first direction X; forming a fourth connection layer 254 on a third region B on a side of the first section A opposite to the first direction X, the fourth connection layer 254 connecting to a top surface of each second plug 230 on the side of the first section A opposite to the first direction X; and forming a fifth connection layer 255, the fifth connection layer 255 connecting to each of the first connection layer 251, the second connection layer 252, the third connection layer 253, and the fourth connection layer 254.

Materials of the first connection layer 251, the second connection layer 252, the third connection layer 253, the fourth connection layer 254, and the fifth connection layer 255 are conductive materials, such as metals.

The semiconductor cell structure is an inverter unit structure. The method for forming a semiconductor cell structure further includes: forming a sixth connection layer 271 connecting to each first gate plug 261; and forming a seventh connection layer 272 connecting to each second gate plug 262.

Materials of the sixth connection layer 271 and the seventh connection layer 272 are conductive materials, such as metals.

Accordingly, referring FIG. 5, the present disclosure provides a semiconductor cell structure, including: a substrate 200 including a first section A and third regions B on both sides of the first section A along a first direction X; a first region A1 and a second region A2 aligned in a first direction X in the first section A, a type of transistors configured to be formed in the first region A1 and the second region A2 is opposite to a type of transistors configured to be formed in the third regions B; a first gate structure group including one or more first gate structures 210 on the substrate 200; the one or more first gate structures 210 extending along the first direction X to the first region A1, the second region A2, and the third regions B on both sides of the first section A.

The semiconductor cell structure further includes first source regions and first drain regions respectively in the first region A1 and the second region A2 on both sides of the one or more first gate structures 210; second source regions and second drain regions in the third regions B on both sides of the one or more first gate structures 210; first plugs 240 on the first drain regions; and second plugs 230 on the second drain regions.

The semiconductor cell structure is an inverter unit structure. The semiconductor cell structure further includes a first connection structure connecting to each first plug 240 and each second plug 230.

The semiconductor cell structure further includes second gate structures 220 on the substrate 200 on both sides of the first gate structure group, part of the second gate structures 220 extending along the first direction X to adjacent first region A1 and third region B, part of the second gate structures 220 extending along the first direction X to adjacent second region A2 and third region B, the second gate structures 220 on the first region A1 and the second gate structures 220 on the second region A2 being disconnected; or the second gate structures extending along the first direction to the first region, the second region, and the third regions on both sides of the first section.

In one embodiment, the first region A1 and the second region A2 are configured to form PMOS transistors. The third regions B are configured to form NMOS transistors.

In other embodiments, the first region A1 and the second region A2 are configured to form NMOS transistors. The third regions B are configured to form PMOS transistors.

In one embodiment, the first connection structure includes: a first connection layer 251 on the first region A1, the first connection layer 251 connecting to a top surfaces of each first plug 240 on the first region A1; a second connection layer 252 on the second region A2, the second connection layer 252 connecting to a top surface of each first plug 240 on the second region A2; a third connection layer 253 on a third region B on a side of the first section A in the first direction X, the third connection layer 253 connecting to a top surface of each second plug 230 on the side of the first section A in the first direction X; a fourth connection layer 254 on a third region B on a side of the first section A opposite to the first direction X, and the fourth connection layer 254 connecting to top surfaces of the second plugs 230 on the side of the first section A opposite to the first direction X; and a fifth connection layer 255 connecting to each of the first connection layer 251, the second connection layer 252, the third connection layer 253, and the fourth connection layer 254.

Extending directions of the first connection layer 251, the second connection layer 252, the third connection layer 253, and the fourth connection layer 254 are all perpendicular to the first direction X. The extension direction of the fifth connection layer 255 is parallel to the first direction X.

The number of the first gate structures 210 is one or more.

In one embodiment, a plurality of first gate structures 210 is taken as an example for description.

The semiconductor cell structure further includes: first gate plugs 261 on each first gate structure 210, the first gate plugs 261 being located between adjacent first regions A1 and third regions B; second gate plugs 262 on each first gate structure 210, the second gate plugs 262 being located between adjacent second region A2 and third region B; a sixth connection layer 271 connecting to each first gate plug 261; and a seventh connection layer 272 connecting to each second gate plug 262.

The semiconductor cell structure further includes: third plugs (not shown) on the first source region; and fourth plugs (not shown) on the second source region.

The semiconductor cell structure is an inverter unit structure. When a type of transistors configured to be formed in the first region and the second region is a P type and a type of transistors configured to be formed in the third regions is an N type, the third plug is electrically connected to a power line, and the fourth plug is electrically connected to a ground line. When the type of transistors configured to be formed in the first region and the second region is an N type and the type of transistors configured to be formed in the third regions is a P type, the third plug is electrically connected to the ground line, and the fourth plug is electrically connected to the power line.

Compared with the existing semiconductor cell structure, the technical solution of the present disclosure has the following advantages.

In the semiconductor cell structure provided by the present disclosure, the type of transistors configured to be formed in the first region and the second region is opposite to the type of transistors configured to be formed in the third region. The first section is among the third regions in the first direction so that the one or more first gate structures on the first region do not need to be disconnected, which effectively reduces the gate stress on the one or more first gate structures in the first region, reduce impact on the stress in the channel region at bottoms of the one or more first gate structures, and avoid reduction of carriers in the channel of the first region, thereby improving operating speed and performance of semiconductor cell structure.

Further, the first connection structure includes a first connection layer, a second connection layer, a third connection layer, a fourth connection layer, and a fifth connection layer. The fifth connection layer connects to the first connection layer, the second connection layer, the third connection layer, and the fourth connection layer. Because lengths of the first connection layer, the second connection layer, the third connection layer, and the fourth connection layer in the extension direction are short, both the rise time and fall time of the semiconductor cell structure are reduced, operating speed of semiconductor cell structure is further improved.

Although the present disclosure is described as above, the present disclosure is not limited thereto. Those skilled in the art can make various changes and modifications without departing from the spirit and scope of the present disclosure. The protection scope of the present disclosure should be subject to the scope defined by the claims.

What is claimed is:

1. A semiconductor cell structure, comprising:
    a substrate including a first section and third regions on both sides of the first section in a first direction, wherein:
        the first section includes a first region and a second region aligned along the first direction, and
        the first region and the second region are configured to form transistors having a type opposite to a type of transistors configured to be formed in the third regions;
    a first gate structure group including one or more first gate structures formed on the substrate, each of the one or more first gate structures extending along the first direction continuously across the first region, the second region, and the third regions on both sides of the first section;
    first gate plugs on each first gate structure, the first gate plugs being located between adjacent first region and third region; and
    second gate plugs on each first gate structure, the second gate plugs being located between adjacent second region and third region, wherein the semiconductor cell structure is an inverter unit structure, and the semiconductor cell structure further comprises:
        a sixth connection layer connecting to each first gate plug; and
        a seventh connection layer connecting to each second gate plug.

2. The structure according to claim 1, further comprises:
    first source regions and first drain regions respectively in the first region and the second region on both sides of the one or more first gate structures; and
    second source regions and second drain regions respectively in the third regions on both sides of the one or more first gate structures.

3. The structure according to claim 2, further comprising:
    third plugs on the first source regions; and
    fourth plugs on the second source regions.

4. The structure according to claim 3, wherein:
    when the type of transistors configured to be formed in the first region and the second region is a P type and the type of transistors configured to be formed in the third regions is an N type, the third plugs are electrically connected to a power line, and the fourth plugs are electrically connected to a ground line; and
    when the type of transistors configured to be formed in the first region and the second region is the N-type and the type of transistors configured to be formed in the third regions is the P-type, the third plugs are electrically connected to the ground line, and the fourth plugs are electrically connected to the power line.

5. The structure according to claim 1, further comprising:
    second gate structures respectively on both sides of the first gate structure group on the substrate, wherein:
        a part of the second gate structures extends along the first direction to adjacent first and third regions, a part of the second gate structures extends along the first direction to adjacent second and third regions, and the second gate structures on the first region and the second gate structures on the second region are disconnected from each other; or
        the second gate structures extend along the first direction to the first region, the second region, and the third regions on both sides of the first section.

6. The structure according to claim 1, wherein the first region and the second region are configured to form PMOS transistors, and the third regions are configured to form NMOS transistors.

7. The structure according to claim 1, wherein the first region and the second region are configured to form NMOS transistors, and the third regions are configured to form PMOS transistors.

8. A semiconductor cell structure, comprising:
    a substrate including a first section and third regions on both sides of the first section in a first direction, wherein:
        the first section includes a first region and a second region aligned along the first direction, the first region and the second region are configured to form transistors having a type opposite to a type of transistors configured to be formed in the third regions;

a first gate structure group including one or more first gate structures formed on the substrate, the one or more first gate structures extending along the first direction across the first region, the second region, and the third regions on both sides of the first section;

first source regions and first drain regions respectively in the first region and the second region on both sides of the one or more first gate structures; and second source regions and second drain regions respectively in the third regions on both sides of the one or more first gate structures, wherein the semiconductor cell structure is an inverter unit structure, and the semiconductor cell structure further comprises:

first plugs on the first drain regions;

second plugs on the second drain regions; and a first connection structure connecting to each first plug and each second plug.

9. The structure according to claim 8, wherein the first connection structure further comprises:

a first connection layer on the first region connecting to a top surface of each first plug on the first region;

a second connection layer on the second region connecting to a top surface of each first plug on the second region;

a third connection layer on a third region on a side of the first section in the first direction, the third connection layer connecting to a top surface of each second plug on the side of the first section in the first direction;

a fourth connection layer on a third region on a side of the first section opposite to the first direction, the fourth connection layer connecting to a top surface of each second plug on the side of the first section opposite to the first direction; and a fifth connection layer connecting to each of the first connection layer, the second connection layer, the third connection layer, and the fourth connection layer.

10. The structure according to claim 8, further comprising:

second gate structures respectively on both sides of the first gate structure group on the substrate, wherein:

a part of the second gate structures extends along the first direction to adjacent first and third regions, a part of the second gate structures extends along the first direction to adjacent second and third regions, and the second gate structures on the first region and the second gate structures on the second region are disconnected from each other; or the second gate structures extend along the first direction to the first region, the second region, and the third regions on both sides of the first section.

11. The structure according to claim 8, wherein the first region and the second region are configured to form PMOS transistors, and the third regions are configured to form NMOS transistors.

12. The structure according to claim 8, wherein the first region and the second region are configured to form NMOS transistors, and the third regions are configured to form PMOS transistors.

13. The structure according to claim 8, further comprising:

third plugs on the first source regions; and fourth plugs on the second source regions.

14. The structure according to claim 13, wherein:

when the type of transistors configured to be formed in the first region and the second region is a P type and the type of transistors configured to be formed in the third regions is an N type, the third plugs are electrically connected to a power line, and the fourth plugs are electrically connected to a ground line; and when the type of transistors configured to be formed in the first region and the second region is the N-type and the type of transistors configured to be formed in the third regions is the P-type, the third plugs are electrically connected to the ground line, and the fourth plugs are electrically connected to the power line.

15. A method of forming a semiconductor cell structure, comprising:

providing a substrate, the substrate including:

a first section and third regions on both sides of the first section in a first direction, wherein:

the first section includes a first region and a second region aligned along the first direction, and the first region and the second region are configured to form transistors having a type opposite to a type of transistors configured to be formed in the third regions;

forming a first gate structure group including one or more first gate structures formed on the substrate, each of the one or more first gate structures extending along the first direction continuously across the first region, the second region, and the third regions on both sides of the first section;

forming first source regions and first drain regions respectively in the first region and the second region on both sides of the one or more first gate structures; and forming second source regions and second drain regions respectively in the third regions on both sides of the one or more first gate structures, wherein the semiconductor cell structure is an inverter unit structure, and forming the semiconductor cell structure further comprises:

forming first plugs on the first drain regions;

forming second plugs on the second drain regions; and forming a first connection structure connecting to each first plug and each second plug.

16. The method according to claim 15, wherein forming the first connection structure further comprises:

forming a first connection layer in the first region, the first connection layer connecting to a top surface of each first plug on the first region;

forming a second connection layer in the second region, the second connection layer connecting to a top surface of each first plug on the second region;

forming a third connection layer on a third region on a side of the first section in the first direction, the third connection layer connecting to a top surface of each second plugs on the side of the first section in the first direction;

forming a fourth connection layer on a third region on a side of the first section opposite to the first direction in, the fourth connection layer connecting to a top surface of each second plugs on the side of the first section opposite to the first direction; and forming a fifth connection layer, the fifth connection layer connecting to each of the first connection layer, the second connection layer, the third connection layer, and the fourth connection layer.

17. The method according to claim 15, wherein forming the semiconductor cell structure further comprises:

forming first gate plugs and second gate plugs on each first gate structure, the first gate plugs being located between adjacent first region and third region, and the second gate plugs being located between adjacent second region and third region;

forming a sixth connection layer connecting to each first gate plug; and forming a seventh connection layer connecting to each second gate plug.

18. The method according to claim 15, further comprising:

forming third plugs on the first source regions;

forming fourth plugs on the second source regions, wherein:

when the type of transistors configured to be formed in the first region and the second region is a P type and the of transistors configured to be formed in the third regions is an N type, the third plugs are electrically connected to a power line, and the fourth plugs are electrically connected to a ground line; and when the type of transistors configured to be formed in the first region and the second region is the N-type and the type of transistors configured to be formed in the third regions is the P-type, the third plugs are electrically connected to the ground line, and the fourth plugs are electrically connected to the power line.

19. The method according to claim 15, further comprising:

forming second gate structures respectively on both sides of the first gate structure group on the substrate, wherein:

a part of the second gate structures extends along the first direction to the adjacent first region and third region, a part of the second gate structures extends along the first direction to adjacent second region and third region, and the second gate structures on the first region and the second gate structures on the second region are disconnected; or the second gate structures extend along the first direction to the first region, the second region, and the third regions on both sides of the first section.

* * * * *